United States Patent
Min et al.

(10) Patent No.: US 8,004,000 B2
(45) Date of Patent: Aug. 23, 2011

(54) POLARIZED LIGHT EMITTING DIODE AND METHOD OF FORMING THE SAME

(75) Inventors: Bok-ki Min, Yongin-si (KR); Cheol-soo Sone, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 119 days.

(21) Appl. No.: 11/797,003

(22) Filed: Apr. 30, 2007

(65) Prior Publication Data

US 2008/0054283 A1  Mar. 6, 2008

(30) Foreign Application Priority Data

Aug. 30, 2006 (KR) .................. 10-2006-0082935

(51) Int. Cl.
*H01L 33/00* (2010.01)
(52) U.S. Cl. .................... 257/98; 257/99
(58) Field of Classification Search .......... 257/98, 257/99, E33.055, E33.067, E33.071–E33.074; 359/486
See application file for complete search history.

(56) References Cited

U.S. PATENT DOCUMENTS

| | | | |
|---|---|---|---|
| 5,955,837 A * | 9/1999 | Horikx et al. | 313/506 |
| 6,108,131 A * | 8/2000 | Hansen et al. | 359/486 |
| 6,122,103 A * | 9/2000 | Perkins et al. | 359/486 |
| 6,234,634 B1 * | 5/2001 | Hansen et al. | 353/20 |
| 6,532,111 B2 * | 3/2003 | Kurtz et al. | 359/486 |
| 7,210,806 B2 * | 5/2007 | Holman et al. | 362/19 |
| 7,786,665 B2 * | 8/2010 | Nakanishi et al. | 313/504 |
| 2005/0199888 A1 * | 9/2005 | Seong et al. | 257/79 |
| 2005/0205884 A1 * | 9/2005 | Kim et al. | 257/98 |
| 2006/0039069 A1 * | 2/2006 | Hayashi et al. | 359/486 |
| 2006/0043400 A1 * | 3/2006 | Erchak et al. | 257/98 |
| 2007/0206164 A1 * | 9/2007 | Beeson et al. | 353/94 |
| 2007/0221867 A1 * | 9/2007 | Beeson et al. | 250/487.1 |

* cited by examiner

*Primary Examiner* — Leonardo Andújar
*Assistant Examiner* — Jordan Klein
(74) *Attorney, Agent, or Firm* — Harness, Dickey & Pierce, P.L.C.

(57) ABSTRACT

Example embodiments are directed to a polarized light emitting diode and method of forming the same. The polarized light emitting diode may include a support layer, a semiconductor layer structure, and/or a polarization control layer. The semiconductor layer structure may be formed on the support layer and may include a light-emitting layer. The polarization control layer may be formed on the semiconductor layer structure and may include a plurality of metal nanowires. The polarized light emitting diode may be configured to control the polarization of emitted light. The method of forming a polarized light emitting diode may include forming on a substrate a semiconductor layer structure with a light emitting layer. A reflecting layer may be formed on the semiconductor layer structure with an attached support layer. The substrate may be removed from the semiconductor layer structure and a polarization control layer including metal nanowires may be formed on the semiconductor layer structure.

21 Claims, 8 Drawing Sheets

POLARIZED LIGHT EMITTING DIODE AND METHOD OF FORMING THE SAME

PRIORITY STATEMENT

This application claims the benefit of Korean Patent Application No. 10-2006-0082935, filed on Aug. 30, 2006, in the Korean Intellectual Property Office, the disclosure of which is incorporated herein in its entirety by reference.

BACKGROUND

Description of the Related Art

Recently, light emitting diodes have gained attention as a new, increasingly efficient, environmental light source. They have been used in a wide range of applications, including, for example, vehicle light sources, display device light sources, optical communications and general lighting sources.

In a variety of applications, polarization properties of light may be used to take advantage of light emitted from a source. A liquid crystal display device may be formed by injecting a liquid crystal material between substrates on which electrodes may be formed. When a voltage is applied between the two electrodes, an electrical field may be generated to change the liquid crystal molecular alignment. This change of the liquid crystal molecular alignment may vary the light transmittance through the liquid crystal material to form images. Because the liquid crystal display may transmit or block light by manipulating the polarization direction of polarized light, only polarized light in one direction may be used.

Because light from a generic source may not be polarized, polarization plates may be provided on both sides of a liquid crystal display. The polarization plates may transmit light polarized in a given direction and absorb light polarized in other directions. Because the polarization plates may absorb about 50 percent of incident light, light efficiency may be relatively low. In an optical communication device, coupling efficiency with external passive optical devices may vary significantly according to the polarization properties of the light, making light polarizing technologies increasingly important.

SUMMARY

Example embodiments are directed to light emitting diodes and methods of forming the same.

According to example embodiments, a polarized light emitting diode may include a support layer, a semiconductor layer structure with a light-emitting layer, and/or a polarization control layer with a plurality of metal nanowires. The semiconductor layer structure may be formed on the support layer and the polarization control layer may be formed on the semiconductor layer structure. The polarized light emitting diode may be configured to control the polarization direction of emitted light.

The polarization control layer may include an oxide layer in which the metal nanowires may be formed. The metal nanowires may have a polygonal cross-section or circular cross-section, including, for example, a rectangular cross-section. The plurality of metal nanowires may have a thickness ranging from about 50 nm to about 1000 nm inclusive. The metal nanowires may have a width less than or equal to about half the pitch of the plurality of parallel metal nanowires.

According to example embodiments, the polarized light emitting diode may also include a reflecting layer arranged between the support layer and the semiconductor layer structure. The plurality of metal nanowires may have a pitch less than or equal to about half of the wavelength of light emitted from the light-emitting layer. The metal nanowires may be formed of for example Al, Au, Ag, Pd, Pt, an alloy thereof or the like. The plurality of metal nanowires may be used as electrodes to apply a voltage to the semiconductor layer structure.

According to example embodiments, the polarized light emitting diode may also include a depolarizing layer for depolarizing light reflected from the polarization control layer. The depolarizing layer may be formed of an optical anisotropic material having a refractive variable index. The reactive index may vary with the polarization of incident light, and may be a scattering layer.

The depolarizing layer may be arranged between the polarization control layer and the semiconductor layer structure, within the semiconductor layer structure, or between the support layer and the semiconductor layer structure. If a reflecting layer is formed between the support layer and the semiconductor layer structure, the depolarizing layer may be formed between the reflecting layer and the semiconductor layer structure as well.

Example embodiments may further include a reflecting layer formed on side surfaces of the support layer, the semiconductor layer structure, and/or the polarization control layer.

According to example embodiments, a method of forming a polarized light emitting diode may include forming a semiconductor layer structure on a substrate. The semiconductor layer structure may include a first semiconductor layer, a light emitting layer, and a second semiconductor layer. A reflecting layer may be formed on the second semiconductor layer, and a support layer may be formed and attached to the reflecting layer. The substrate may be removed from the semiconductor layer structure, and the polarization control layer may be formed on the first semiconductor layer. The polarization control layer may include metal nanowires.

BRIEF DESCRIPTION OF THE DRAWINGS

Example embodiments will become more apparent by describing in detail the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
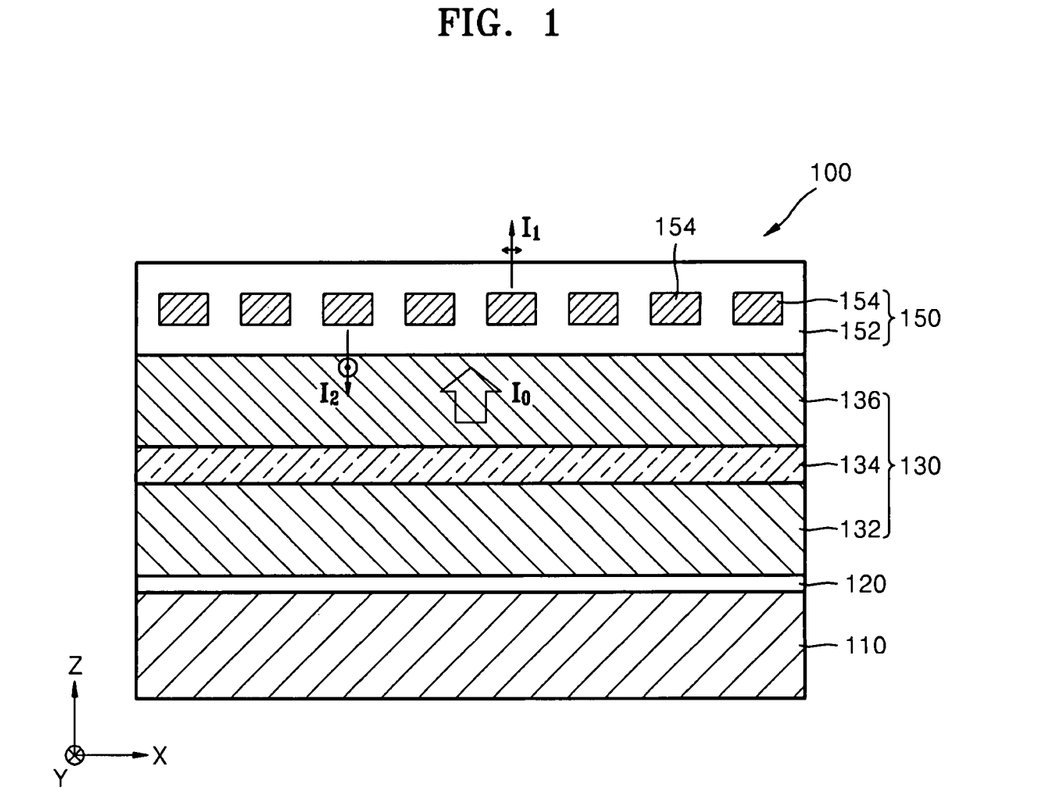
FIG. 1 is a cross-sectional view illustrating a polarized light emitting diode according to an example embodiment.
Figure 2:
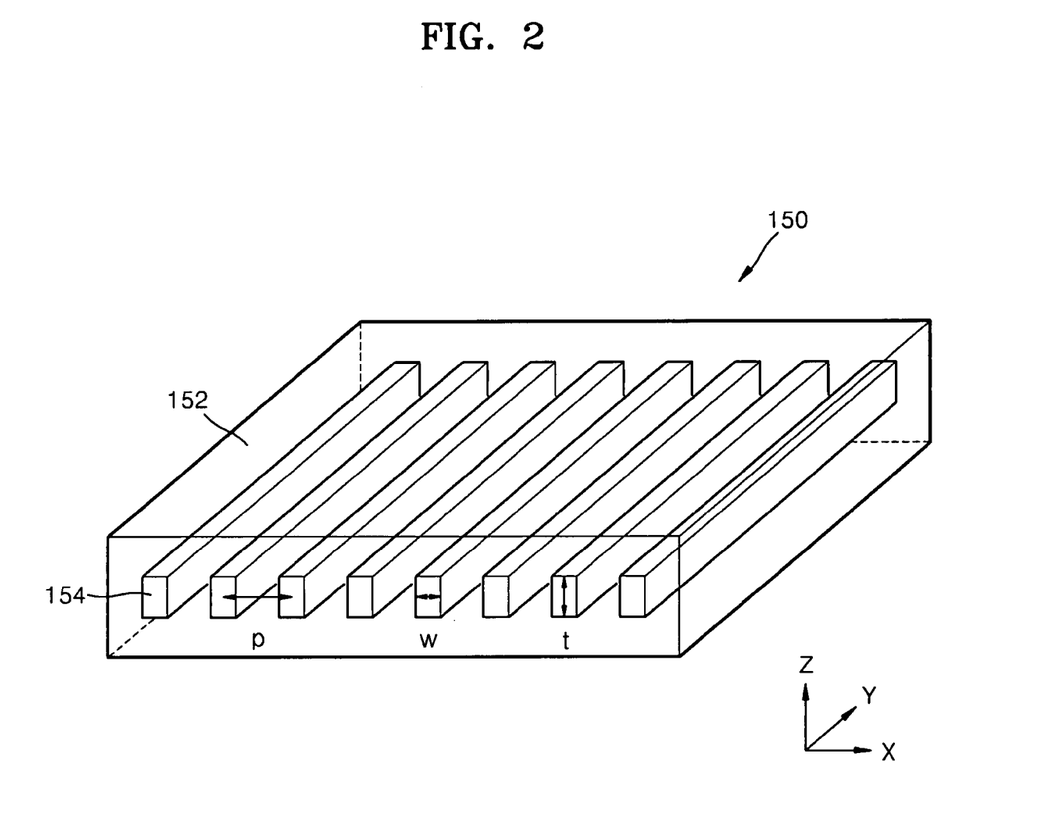
FIG. 2 is a view illustrating an example configuration of a polarization control layer in the polarized light emitting diode illustrated in FIG. 1.

FIG. 1 is a cross-sectional view illustrating a polarized light emitting diode 100 according to an example embodiment. FIG. 2 is a view illustrating an example configuration of a polarization control layer 150 in the polarized light emitting diode 100 illustrated in FIG. 1. Referring to FIGS. 1 and 2, the polarized light emitting diode 100 may include a support layer 110, a semiconductor layer structure 130 formed on the support layer 110, and/or a polarization control layer 150 formed on the semiconductor layer structure 130. The semiconductor layer structure 130 may include one or more semiconductor layers. Although the semiconductor layer structure may be referred to herein as a semiconductor multi-layer for example purposes, it will be understood that the example embodiments are not intended to be limited by the use of this term.

A semiconductor multi-layer 130 may include a first semiconductor layer 132, a second semiconductor layer 136, and a light-emitting layer 134 formed between the first semiconductor layer 132 and the second semiconductor layer 136. The first semiconductor layer 132 may be P-type and the second semiconductor layer 136 may be N-type, for example. The light-emitting layer 134 may be formed in a multi-quantum well structure, for example.

A reflecting layer 120 may be formed between the support layer 110 and the semiconductor multi-layer 130. The reflecting layer 120 may reflect light emitted from the light-emitting layer 134 back towards the polarization control layer 150. The reflecting layer 120 may be formed of, for example, a metal layer or a dielectric mirror. A metal layer may include reflective materials, for example, Al, Au, Ag, Pd, Pt, or an alloy thereof, or the like. A dielectric mirror may have a structure in which dielectric materials having different refractive indexes may be formed in a repeating pattern.

Light emitting diodes may be thin-film type LEDs, which may have upper and lower surfaces that are significantly larger than the side surfaces. Therefore, much of the light emitted from the light-emitting layer 134 may be emitted through the polarization control layer 150. If a large amount of light is lost through the side surfaces, a reflecting layer, for example, a dielectric mirror, may be formed on the side surfaces to reduce the amount of light lost via the sides. The reflecting layer may include an insulating layer and a reflective metal layer, for example, Al, Au, Ag, Pd, Pt, or an alloy thereof, or the like.

The polarization control layer 150 may be configured to control the polarization of the light emitted from the light-emitting layer 134. The polarization control layer 150 may include a plurality of metal nanowires 154. For example, the polarization control layer 150 may include an oxide layer 152 in which a plurality of metal nanowires 154 may be formed. The oxide layer 152 may include transparent electrode materials, for example, ITO, ZnO, etc . . . , and a transparent oxide, for example, $SiO_2$ or the like. The plurality of metal nanowires 154 may be arranged along a first direction (X direction illustrated in FIG. 1), with an associated pitch (p). The longitudinal direction of the plurality of metal nanowires 154 may be a second direction (Y direction illustrated in FIG. 1). A cross-section of the plurality of metal nanowires 154 may have a rectangular shape with a predetermined or given width (w) and a predetermined or given thickness (t). The cross-sectional shape of the metal nanowires 154 is not limited to merely a rectangular shape and may include other shapes as well, for example, any polygonal shape or circular shape, including elliptical and non-circular but rounded shapes.

The plurality of metal nanowires 154 may reflect incident light whose polarization direction is parallel to the longitudinal direction of the metal nanowires 154. The plurality of metal nanowires 154 may also transmit incident light whose polarization direction is parallel to the width direction of the metal nanowires 154. The plurality of metal nanowires 154 may include a reflective metallic material, for example, Al, Au, Ag, Pd, Pt, an alloy thereof or other materials with similar reflective properties. Because the metal materials may be conductive, the plurality of metal nanowires 154 may be used as an electrode in order to apply a voltage to the semiconductor multi-layer 130.

The width (w), the thickness (t), and the pitch (p) (or alternative dimensional measurements of the polarization control layer 150) may be selected by considering the metal nanowires 154 material composition and the wavelength ($\lambda$) of light incident to the polarization control layer 150. The thickness (t) of the metal nanowires 154 should be thick enough to reflect light which may be polarized in the longitudinal direction of the metal nanowires 154. For example, the thickness (t) of the metal nanowires 154 may be approximately 50 nm or more. For an optical absorption, the thickness (t) of the metal nanowires 154 may be approximately 1000 nm. The width (w) of the metal nanowires 154 may be sufficiently shorter than the wavelength of light emitted from the light-emitting layer 134. In addition, the pitch (p) between the metal nanowires 154 may be less than or equal to about $\lambda/2$ in order to reduce or prevent any diffraction effects that may arise with regular arrangements of optical elements.

Figure 3A:
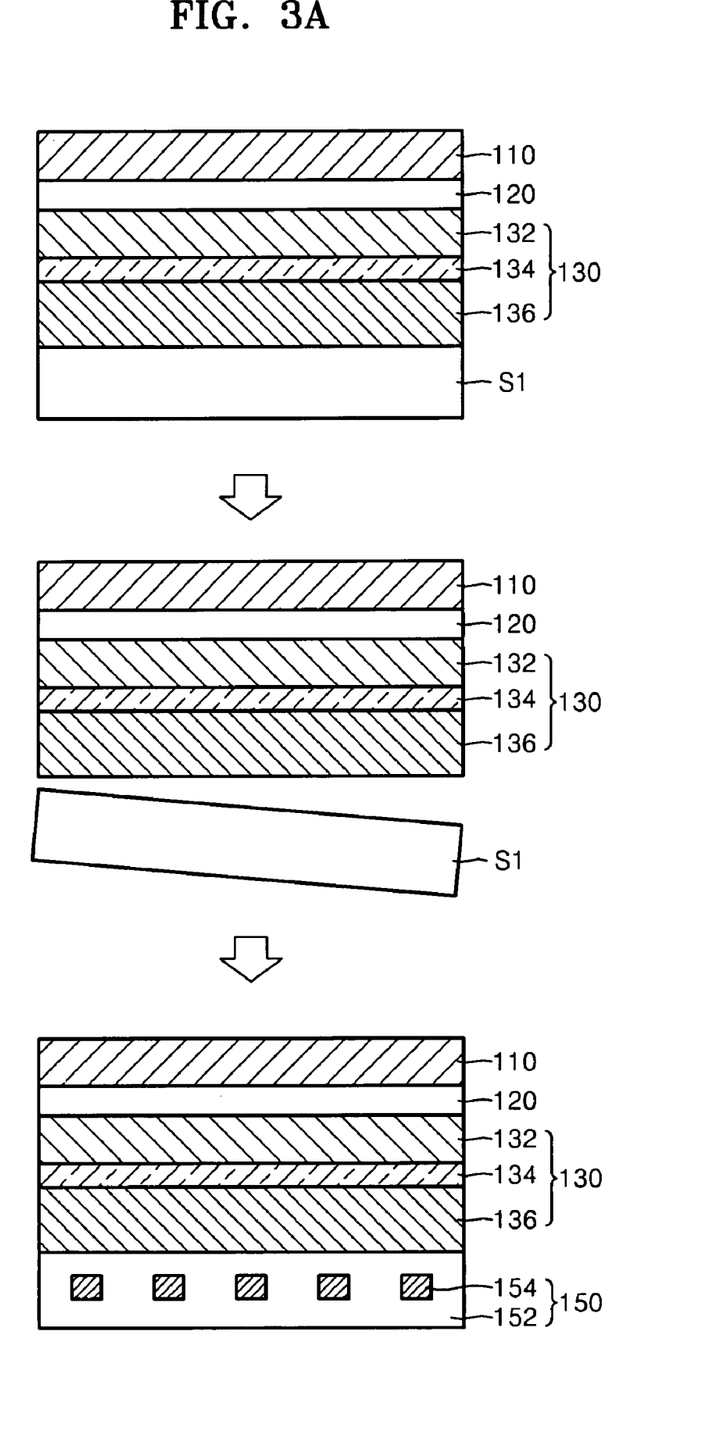
FIGS. 3A and 3B are views detailing a method of forming a polarized light emitting diode according to an example embodiment.
Figure 3B:
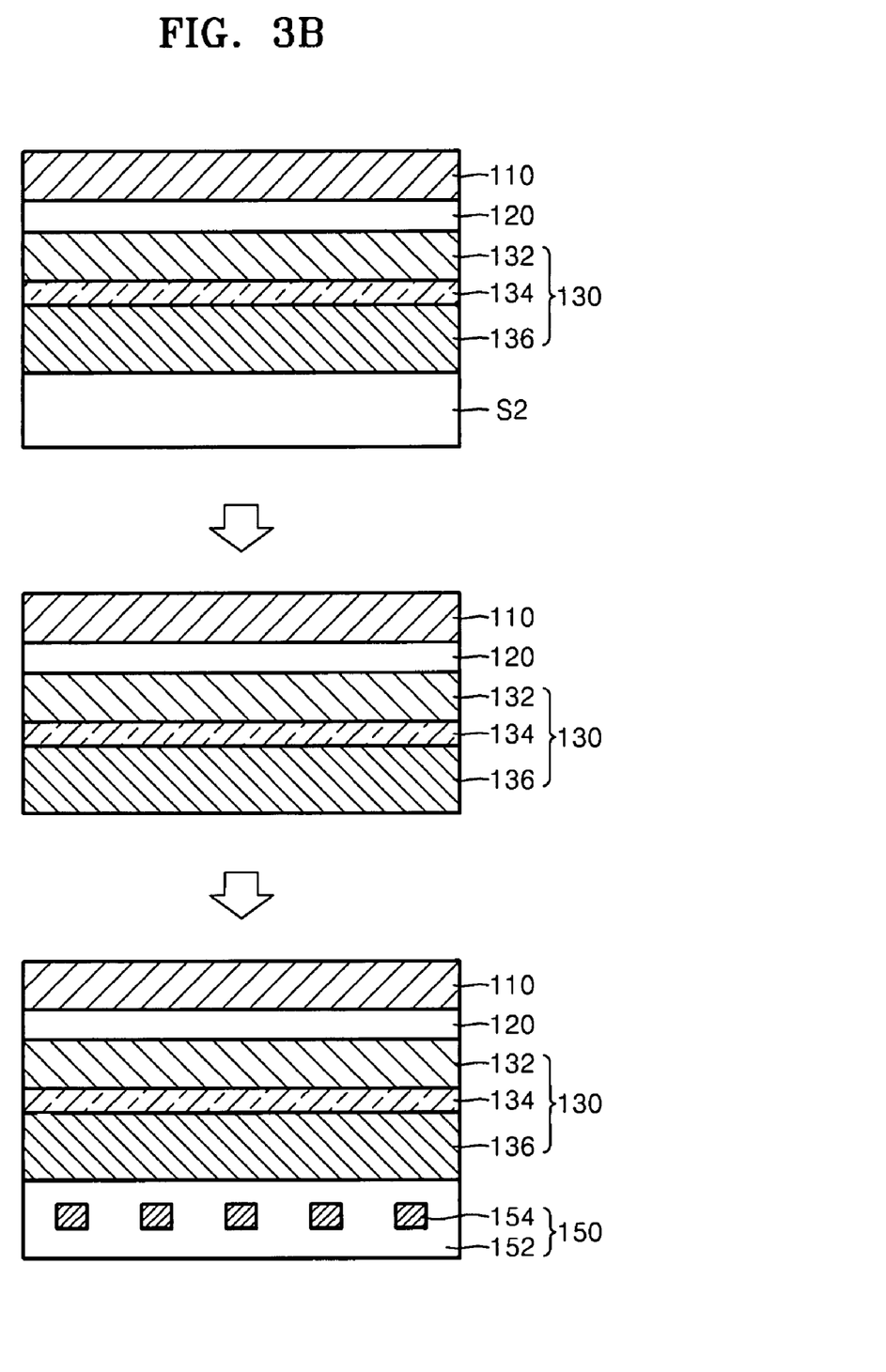

FIGS. 3A and 3B are views illustrating a method of manufacturing a polarized light emitting diode according to an example embodiment.

Referring to FIG. 3A, a semiconductor multi-layer 130 may be formed on a sapphire substrate (S1). The semiconductor multi-layer 130 may include a first semiconductor layer 136, a light-emitting layer 134, and a second semiconductor layer 132 on the sapphire substrate (S1). The first and second semiconductor layers may be of different conductive types. For example, the first semiconductor layer 136 and the second semiconductor layer 132 may be an N-type GaN layer and a P-type GaN layer, respectively. A reflecting layer 120 may be formed on the second semiconductor layer 132, and a support layer 110 may be attached to the reflecting layer 120 by bonding or plating. The sapphire substrate (S1) may be detached from the rest of the structure by various means, including, for example, laser lift-off methods, chemical lift-off methods or the like. Secondly, a polarization control layer 150 having metal nanowires 154, may be formed on the first semiconductor layer 136.

FIG. 3B is a view illustrating the use of a SiC substrate (S2) to form a semiconductor multi-layer 130, according to an example embodiment. When a SiC substrate (S2) is used as in FIG. 3B, chemical mechanical polishing (CMP), selective etching or the like may be used in order to make the SiC substrate (S2) thinner or remove it entirely. Accordingly, although the SiC substrate (S2) may be shown as completely removed in FIG. 3B, a portion of the SiC substrate (S2) may actually remain. Subsequently, a polarization control layer 150 having metal nanowires 154 may be formed on the first semiconductor layer 136.

However, it may be possible to manufacture a semiconductor multi-layer and a polarization control layer on the same substrate successively.

When voltage is applied between the second semiconductor layer 132 and the first semiconductor layer 136 using electrodes (not shown), carriers of the second semiconductor layer 132 and carriers of the first semiconductor layer 136 may be combined in the light-emitting layer 134, so that light may be created in and emitted from the light-emitting layer 134. This light may be non-polarized light; for example, the polarization of the light may be arbitrary (e.g., even in all directions).

The polarization control layer 150 may control the polarization direction of the light by using the response characteristics of free electrons in the metal nanowires to the different polarization directions of the light. When light $I_2$, with a second polarization that is parallel to the longitudinal direction of the metal nanowires 154, among light $I_0$ (non-polarized light) emitted from the light-emitting layer 134 is incident on the metal nanowires 154, the free electrons of the metal nanowires 154 may vibrate in the longitudinal direction of the metal nanowires 154. This vibration of the free electrons generates electromagnetic waves that may interfere with the incident light $I_2$. Therefore, much of the light $I_2$ with a second polarization that is parallel to the longitudinal direction of the metal nanowires 154 may be reflected (the rest may be absorbed) by interference with the electromagnetic waves.

On the other hand, much of light $I_1$, with a first polarization that is parallel to the transverse direction of the metal nanowires 154, may be transmitted through the metal nanowires 154 (the rest may be absorbed) because it may be difficult for the free electrons of the metal nanowires 154 to vibrate in the transverse direction of the metal nanowires 154 due to spatial limitations. For example, the metal nanowires 154 may exhibit a reflective characteristic for light $I_2$ with a second polarization, and a lossy dielectric material characteristic for light $I_1$ with a first polarization.

Figure 4:
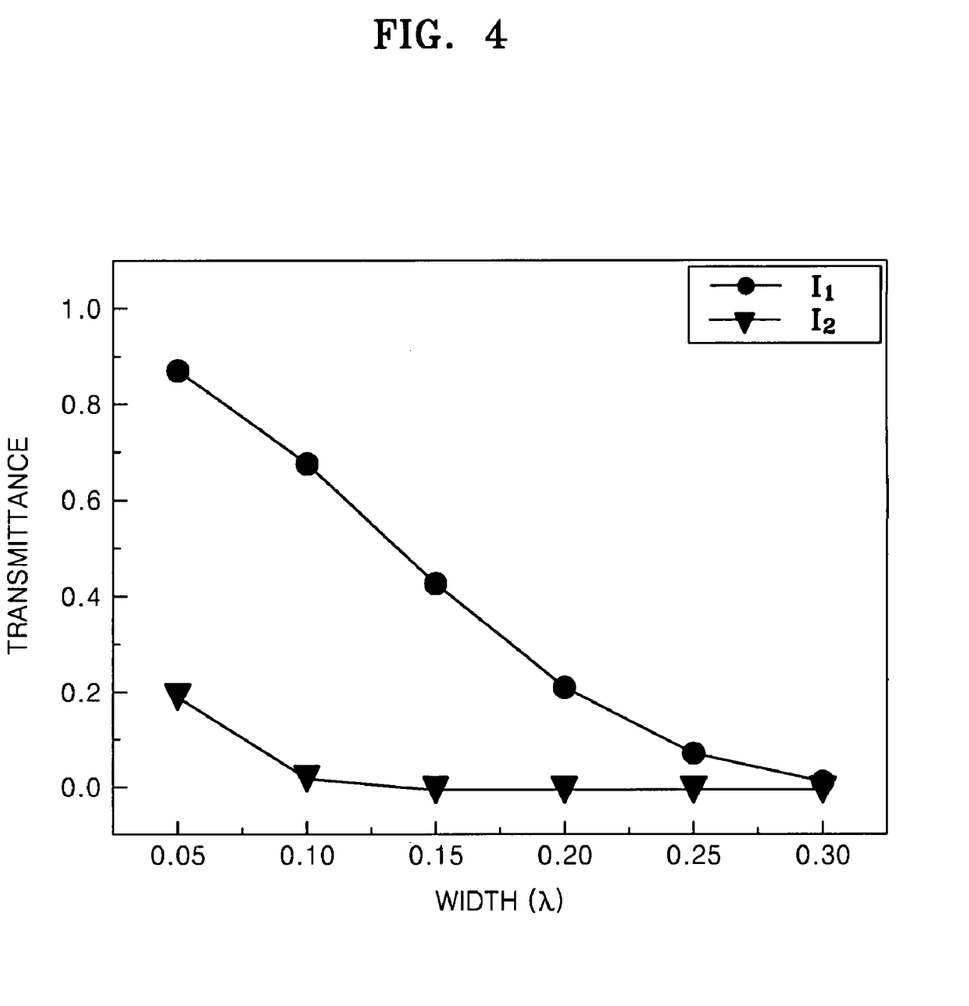
FIG. 4 illustrates example transmittance data for a polarization control layer as a function of the width of the metal nanowires.
Figure 5:
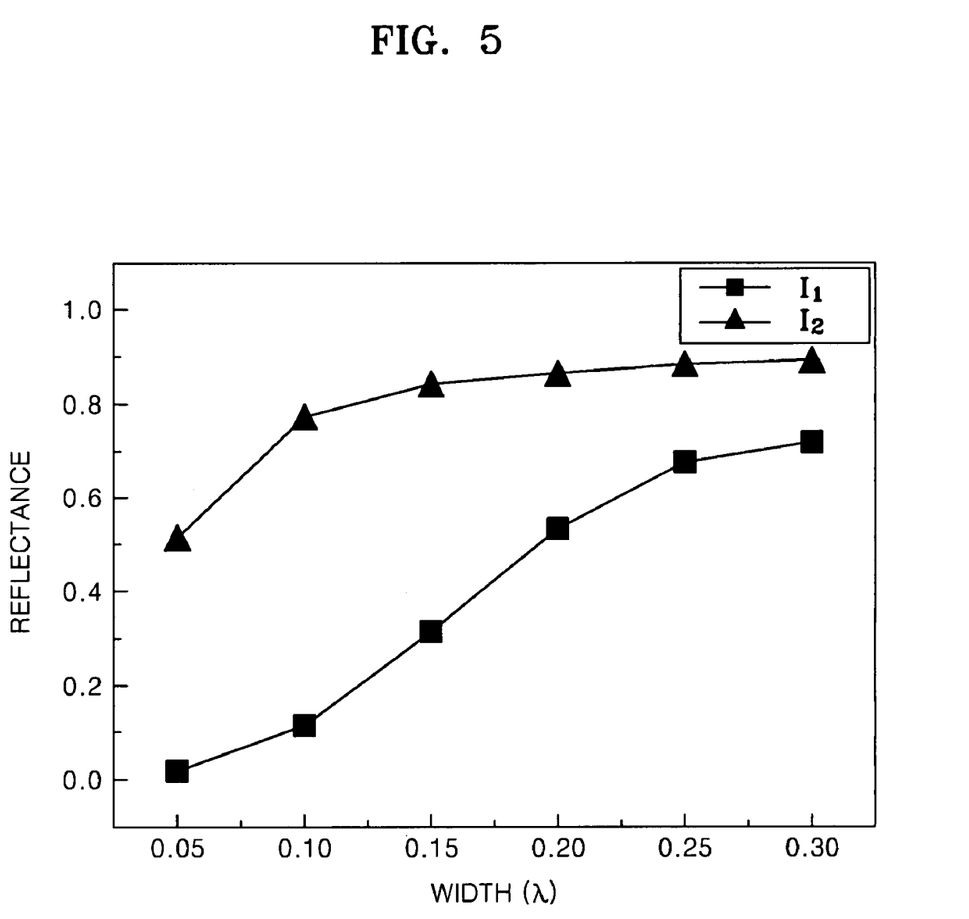
FIG. 5 illustrates example reflectance data for a polarization control layer as a function of the width of the metal nanowires.

FIG. 4 is a graph illustrating the transmittance of the example polarization control layer 150 as a function of the width (w) of the metal nanowires 154, expressed as a fraction of the wavelength $\lambda$ of the incident light. FIG. 5 is a graph illustrating the reflectance of the example polarization control layer 150 as a function of the width (w) of the metal nanowires 154, expressed as a fraction of the wavelength $\lambda$ of the incident light. The graphs of FIGS. 4 and 5 show transmittance and reflectance data, respectively, for the first polarization component $I_1$ and the second polarization component $I_2$ of light $I_0$ emitted from the light-emitting layer 134. The example graphs of FIGS. 4 and 5 correspond to the wavelength of light $I_0$ being about 460 nm, the width (w) of the metal nanowires 154 being about 150 nm, and the pitch (p) of the metal nanowires 154 being about one third of the wavelength of light $I_0$.

Referring to FIG. 4, the transmittance of the first polarization component $I_1$ may be larger than that of the second polarization component $I_2$, regardless of the width (w) of the metal nanowires 154. As described above, because the free electrons of the metal nanowires 154 may not vibrate significantly in the first direction of the metal nanowires 154 due to insufficient space, the incident first polarization component $I_1$ may be transmitted effectively. However, as the width (w) of the metal nanowires 154 is increased, the transmittance of both the first polarization component $I_1$ and the second polarization component $I_2$ may be decreased. As the width (w) becomes larger, the free electrons may vibrate more in the transverse (width) direction of the metal nanowires 154, and both the first polarization component $I_1$ and the second polarization component $I_2$, the metal nanowires 154 may work as reflecting metals.

The graph illustrated in FIG. 5 describes the reflectance of the polarization control layer 150, and may demonstrate several features in reverse of that of FIG. 4. For example, regardless of the width (w) of the metal nanowires 154, the reflectance of the second polarization component $I_2$ may be larger than that of the first polarization component $I_1$. As the width (w) of the metal nanowires 154 is increased, the reflectance of the first and second components $I_1$ and $I_2$ may be likewise increased. The width (w) of the metal nanowires 154 may be sufficiently shorter than the wavelength $\lambda$ of the light emitted from the light-emitting layer 134. The width (w) of the metal nanowires 154 may be appropriately determined from the pitch (p) of the metal nanowires 154. For example, in order to transmit about 40% or more of light $I_0$ incident on the polarization control layer 150 when the pitch (p) of the metal nanowires 154 is about one third of the wavelength λ, the width (w) of the metal nanowires 154 may be shorter than about one half of the pitch (p) of the metal nanowires 154.

Figure 6:
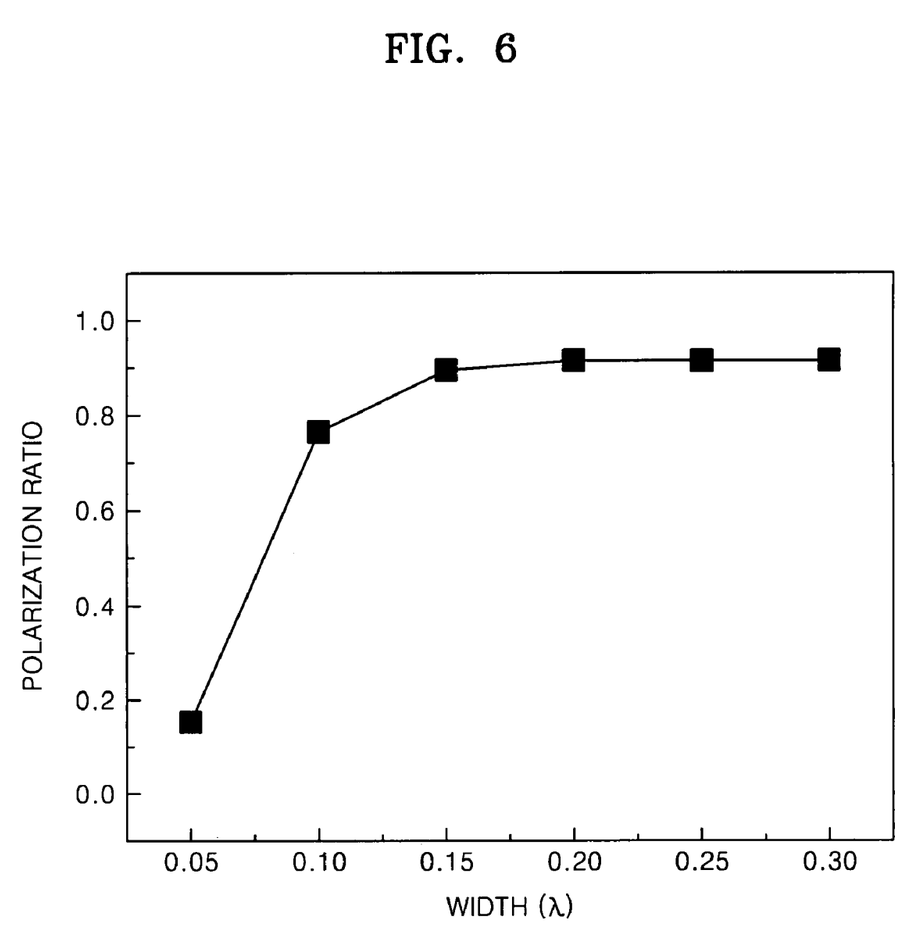
FIG. 6 illustrates example polarization ratio data with respect to the width of the metal nanowires and for light transmitted through a polarization control layer.

FIG. 6 is a graph illustrating example polarization ratio data with respect to the width (w) of the metal nanowires 154, expressed as a fraction of the wavelength λ of the incident light, for light transmitted through the polarization control layer 150. The polarization ratio may be a useful index for the polarization properties of the light transmitted through the polarization control layer 150. The polarization ratio may be defined for the light transmitted through the polarization control layer 150 as the ratio of the difference between the first polarization component $I_1$ and the second polarization component $I_2$ of the transmitted light to the sum of the first polarization component $I_1$ and the second polarization component $I_2$ of the transmitted light. For example, the polarization ratio may be defined mathematically as $(T(I_2)-T(I_2))/(T(I_1)+T(I_2))$.

FIG. 6 shows that as the width (w) of the metal nanowires 154 increases, the polarization ratio may approach a value of 1. The reason for this may be that as the width (w) of the metal nanowires 154 increases, although both the transmittance of the first polarization component $I_1$ and the second polarization component $I_2$ may decrease, the transmittance of the second polarization component $I_2$ may approach 0 faster than the transmittance of the first polarization component $I_1$. The width (w) of the metal nanowires 154 may, therefore, be determined according to the pitch (p) of the plurality of parallel metal nanowires 154, such that both the polarization ratio and the transmittance of the first polarization component $I_1$ may be sufficiently large. For example, for the transmitted amount of the first polarization component ($I_1$) to be more than about half the amount of the incident light, and for the polarization ratio to be about 0.8 or more, the width (w) of the metal nanowires 154 may range from about 0.1 to about 0.15 of the wavelength λ of the incident light.

Figure 7:
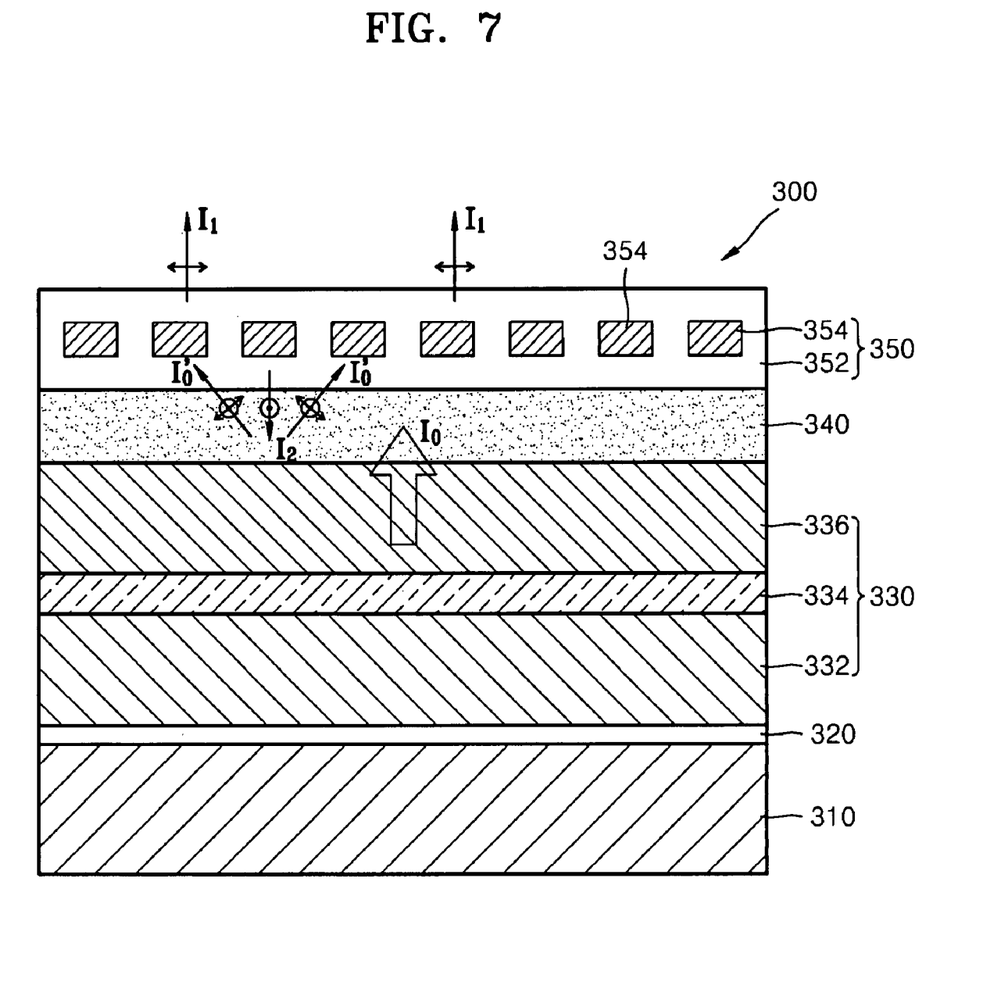
FIG. 7 is a cross-sectional view illustrating a polarized light emitting diode according to an example embodiment.

FIG. 7 is a cross-sectional view illustrating a polarized light emitting diode 300 according to example embodiments. Referring to FIG. 7, the polarized light emitting diode 300 may include a support layer 310, a semiconductor multi-layer 330 formed on the support layer 310, a depolarizing layer 340 formed on the semiconductor multi-layer 330, and a polarization control layer 350 formed on the depolarizing layer 340. A reflecting layer 320 may be formed between the support layer 310 and the semiconductor multi-layer 330. The reflecting layer 320 may reflect light emitted from a light-emitting layer 334 back towards the polarization control layer 350. The reflecting layer 320 may be formed, for example, from a metal layer or a dielectric mirror. The metal layer may include reflective materials, for example, Ag, Au, Pt, Al Pd, an alloy thereof, or other materials with similar properties. The dielectric mirror may have a structure in which dielectric materials having different refractive indexes may be formed in a repeating pattern.

The semiconductor multi-layer 330 may include a first semiconductor layer 332, a second semiconductor layer 336, and a light-emitting layer 334 formed between the first semiconductor layer 332 and the second semiconductor layer 336. The first and second semiconductor layers may be of different conducting types, for example, N-type, P-type, etc . . . . For example, the light-emitting layer 334 may be formed in a multi-quantum well structure.

The polarization control layer 350 may control the polarization of the light emitted from the light-emitting layer 334. The polarization control layer 350 may include a plurality of metal nanowires 354. For example, the polarization control layer 350 may include an oxide layer 352 in which the plurality of metal nanowires 354 may be formed. The oxide layer 352 may include transparent electrode materials, for example, ITO, ZnO, or the like, and/or a transparent oxide, for example, $SiO_2$ or the like. The plurality of metal nanowires 354 may be arranged along a first direction (e.g., the x-axis direction in FIG. 1) and may have an associated pitch (p). The longitudinal direction of the plurality of metal nanowires 354 may be a second direction (e.g., the y-axis direction in FIG. 1). The cross-section of the plurality of metal nanowires 354 may be a rectangular form with a predetermined or given width (w) and thickness (t). As described above, the cross-section may have different shapes and should not be construed as limited to the rectangular type alone. The plurality of metal nanowires 354 may reflect the polarization component of the incident light that is parallel to the longitudinal direction of the metal nanowires 354.

The plurality of metal nanowires 354 may transmit the polarization component of the incident light that is parallel to the transverse direction of the metal nanowires 354. The plurality of metal nanowires 354 may include a reflective metal layer, for example, Al, Au, Ag, Pd, Pt, an alloy thereof or the like. The polarization control layer 350 may have the same configuration as the polarization control layer 150 in FIG. 1. For example, the first polarization component $I_1$ of light $I_0$ emitted from the light-emitting layer 334 may be transmitted through the polarization control layer 350, and the second polarization component $I_2$ of the light $I_0$ may be reflected by the polarization control layer 350.

The depolarizing layer 340 may change the second polarization component $I_2$ reflected by the polarization control layer 350 into non-polarized light ($I_0'$). As illustrated in FIG. 7, the depolarizing layer 340 may be provided between the semiconductor multi-layer 330 and the polarization control layer 350. The depolarizing layer 340 may alternately be provided between the reflecting layer 320 and the semiconductor multi-layer 330, or as part of the semiconductor multi-layer 330. Accordingly, the location of the depolarizing layer 340 may vary within the scope of example embodiments.

The depolarizing layer 340 may be formed of an optical, anisotropic material. Because the refractive index of the optical anisotropic material may vary with the polarization of the incident light, the path of the light reflected or refracted from the optical anisotropic material may also vary with the polarization of the light. Thus, the light may become non-polarized by being reflected or refracted by the optical anisotropic material. The depolarizing layer 340 may be formed from a scattering layer with diffusive material. Diffusion may occur due to minute changes in the refractive index of the scattering layer, thereby changing the incident light into non-polarized light.

Because much of the light reflected by the polarization control layer 350 has a second polarization component $I_2$, light having a first polarization component $I_1$ may be regenerated by changing the light reflected from the polarization control layer 350 into non-polarized light using the depolarizing layer 340. Thus, regenerated light having the first polarization component $I_1$ may be transmitted through the polarization control layer 350 so that more light having the first polarization component $I_1$ may be discharged.

According to example embodiments, a polarized light emitting diode may include a polarization control layer having a plurality of metal nanowires, and may emit polarized light. A polarized light emitting diode may further include a depolarizing layer to increase the emission of polarized light. A polarized light emitting diode according to example embodiments may be useful, for example, as a light source that directly emits polarized light in optical communication devices or display devices which make use of certain polarization properties.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A light emitting diode, comprising:
   a support layer;
   a semiconductor layer structure on the support layer, the semiconductor layer structure including a light-emitting layer; and
   a polarization control layer on the semiconductor layer structure, the polarization control layer including a plurality of metal nanowires and a transparent conducting layer, and being configured to control the polarization of emitted light, the plurality of metal nanowires enclosed within the transparent conducting layer so as to not contact a surface of the semiconductor layer structure, wherein an entire surface of the plurality of metal nanowires enclosed within the transparent conducting layer is directly in contact with the transparent conducting layer.

2. The light emitting diode of claim 1, wherein each of the plurality of metal nanowires has a polygonal or a circular cross-section.

3. The light emitting diode of claim 2, wherein the cross-section of each of the plurality of metal nanowires is rectangular.

4. The light emitting diode of claim 3, wherein each of the plurality of metal nanowires has a thickness between about 50 nm to about 1000 nm, inclusive.

5. The light emitting diode of claim 3, wherein each of the plurality of metal nanowires has a width smaller than half of the pitch of the plurality of metal nanowires.

6. The light emitting diode of claim 1, further comprising:
   a reflecting layer between the support layer and the semiconductor layer structure.

7. The light emitting diode of claim 1, wherein each of the plurality of metal nanowires has a pitch smaller than half of a wavelength of light emitted from the light-emitting layer.

8. The light emitting diode of claim 1, wherein each of the plurality of metal nanowires are made of Al, Au, Ag, Pd, Pt, or an alloy thereof.

9. The light emitting diode of claim 1, wherein at least one of the metal nanowires of the plurality of metal nanowires is an electrode for applying a voltage to the semiconductor layer structure.

10. The light emitting diode of claim 1, further comprising:
    a depolarizing layer configured to depolarize light reflected from the polarization control layer.

11. The light emitting diode of claim 10, wherein the depolarizing layer is made of an optical anisotropic material having a variable refractive index according to the polarization of incident light.

12. The light emitting diode of claim 10, wherein the depolarizing layer is a scattering layer.

13. The light emitting diode of claim 10, wherein the depolarizing layer is between the support layer and the semiconductor layer structure.

14. The light emitting diode of claim 10, wherein the depolarizing layer is between the polarization control layer and the semiconductor layer structure.

15. The light emitting diode of claim 10, wherein the depolarizing layer is in the semiconductor layer structure.

16. The light emitting diode of claim 10, further comprising:
    a reflecting layer between the support layer and the semiconductor layer structure.

17. The light emitting diode of claim 16, wherein the depolarizing layer is between the reflecting layer and the semiconductor layer structure.

18. The light emitting diode of claim 10, further comprising:
    a reflecting layer on each side surface of the support layer, the semiconductor layer structure, and the polarization control layer.

19. The light emitting diode of claim 1, further comprising:
    a reflecting layer on each side surface of the support layer, the semiconductor layer structure, and the polarization control layer.

20. The light emitting diode of claim 1, wherein the transparent conducting layer is made of ITO or ZnO.

21. A method of forming a polarized light emitting diode, the method comprising:
    forming a semiconductor layer structure on a substrate, the semiconductor layer structure including a first semiconductor layer, a light emitting layer, and a second semiconductor layer;
    forming a reflecting layer on the second semiconductor layer;
    forming a support layer and attaching it to the reflecting layer;
    removing the substrate from the semiconductor layer structure; and
    forming a polarization control layer on the first semiconductor layer, the polarization control layer including metal nanowires and a transparent conducting layer, the metal nanowires enclosed within the transparent conducting layer so as to not contact a surface of the semiconductor layer structure, wherein an entire surface of the metal nanowires enclosed within the transparent conducting layer is directly in contact with the transparent conducting layer.

* * * * *

UNITED STATES PATENT AND TRADEMARK OFFICE
CERTIFICATE OF CORRECTION

| | | |
|---|---|---|
| PATENT NO. | : 8,004,000 B2 | Page 1 of 1 |
| APPLICATION NO. | : 11/797003 | |
| DATED | : August 23, 2011 | |
| INVENTOR(S) | : Bok-ki Min and Cheol-soo Sone | |

It is certified that error appears in the above-identified patent and that said Letters Patent is hereby corrected as shown below:

Title Page, Item (73) Assignee; should read,

-- (73) Assignee: Samsung LED Co., Ltd. --.

Signed and Sealed this
First Day of November, 2011

David J. Kappos
*Director of the United States Patent and Trademark Office*